(12) United States Patent
Parker et al.

(10) Patent No.: US 7,123,022 B2
(45) Date of Patent: Oct. 17, 2006

(54) METHOD AND APPARATUS FOR NON-CONTACT TESTING AND DIAGNOSING ELECTRICAL PATHS THROUGH CONNECTORS ON CIRCUIT ASSEMBLIES

(75) Inventors: Kenneth P. Parker, Ft Collins, CO (US); Chris R. Jacobsen, Ft Collins, CO (US); Myron J. Schneider, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/836,862

(22) Filed: Apr. 28, 2004

(65) Prior Publication Data

US 2005/0242824 A1 Nov. 3, 2005

(51) Int. Cl.
*G01R 31/02* (2006.01)
(52) U.S. Cl. ........................ 324/538; 324/758
(58) Field of Classification Search ........ 324/538, 324/688, 758
See application file for complete search history.

(56) References Cited

U.S. PATENT DOCUMENTS

| | | | |
|---|---|---|---|
| 5,151,659 A * | 9/1992 | Tanaka et al. | 324/458 |
| 5,420,500 A | 5/1995 | Kerschner | |
| 5,498,964 A | 3/1996 | Kerschner et al. | |
| 5,557,209 A | 9/1996 | Crook et al. | |
| 6,201,398 B1 * | 3/2001 | Takada | 324/537 |

\* cited by examiner

*Primary Examiner*—Walter Benson

(57) ABSTRACT

A device for enabling testing of electrical paths through a circuit assembly is presented. The device may include a non-contact connector test probe for a testing a connector of the circuit assembly. A method for testing continuity of electrical paths through a circuit assembly is presented. In the method, one or more nodes of the circuit assembly are stimulated, connector pins of a connector on the circuit assembly are capacitively coupled to a non-contact connector test probe, and an electrical characteristic is measured by a tester coupled to the non-contact connector test probe to determine continuity of electrical paths through the circuit assembly.

7 Claims, 9 Drawing Sheets

METHOD AND APPARATUS FOR NON-CONTACT TESTING AND DIAGNOSING ELECTRICAL PATHS THROUGH CONNECTORS ON CIRCUIT ASSEMBLIES

BACKGROUND OF THE INVENTION

During manufacture, circuit assemblies (e.g., printed circuit boards and Multi-Chip Modules) need to be tested for interconnect defects such as open solder joints, broken connectors, and bent or misaligned leads (e.g., pins, balls, or spring contacts). One way to test for such defects is via capacitive lead-frame testing. FIGS. 1 & 2 illustrate an exemplary setup for capacitive lead-frame testing. FIG. 1 illustrates a circuit assembly 100 comprising an integrated circuit (IC) package 102 and a printed circuit board 104. Enclosed within the IC package is an IC 106. The IC is bonded to the leads 108, 110 of a lead-frame via a plurality of bond wires 112, 114. The leads, in turn, are meant to be soldered to conductive traces on the printed circuit board. Note, however, that one of the leads 108 is not soldered to the printed circuit board, thereby resulting in an "open" defect.

Positioned above the IC package 102 is a capacitive lead-frame test assembly 116. The exemplary test assembly 116 shown comprises a sense plate 118, a ground plane 120, and a buffer 122. The test assembly is coupled to an alternating current (AC) detector 124. A first, grounded test probe, TP_1, is coupled to lead 110 of the IC package. A second test probe, TP_2, is coupled to lead 108 of the IC package. The second test probe is also coupled to an AC source 126.

FIG. 2 shows an equivalent circuit for the apparatus shown in FIG. 1. In the equivalent circuit, $C_{Sense}$ is the capacitance seen between the sense plate 118 and the lead 108 being sensed, and $C_{Joint}$ is the capacitance seen between the lead 108 and the conductive trace (on the printed circuit board) to which the lead is supposed to be soldered. The switch, S, represents the quality of the lead being tested. If the lead being tested is good, switch S is closed, and the capacitance seen by the AC detector is $C_{Sense}$. If the lead being tested is bad, switch S is open, and the capacitance seen by the AC detector is $C_{Sense}*C_{Joint}/(C_{Sense}+C_{Joint})$. If $C_{Sense}$ is significantly larger than any possible $C_{Joint}$, a bad lead will result in the AC detector seeing a capacitance near $C_{Joint}$. As a result, the AC detector must have sufficient resolution to distinguish $C_{Sense}$ from $C_{Joint}$.

Additional and more detailed explanations of capacitive lead-frame testing are found in U.S. Pat. No. 5,557,209 of Crook et al. entitled "Identification of Pin-Open Faults by Capacitive Coupling Through the Integrated Circuit Package", and in U.S. Pat. No. 5,498,964 of Kerschner entitled "Capacitive Electrode System for Detecting Open Solder Joints in Printed Circuit Assemblies".

Over the years, various factors have interfered with the success of capacitive lead-frame testing. One factor is a lack of capacitive coupling between an IC lead-frame and a tester's sense plate. This problem is largely traced to the on-going miniaturization of IC packages and their lead-frames, as well as the imposition of ground shield and heat sinks between lead-frames and the sensor plate (some of which are internal to an IC's package). The miniaturization of lead-frames is also exacerbated by "area connection" packages. In an area connection package, the package's lead-frame is laid out as an array on a surface of the package, rather than in rows along the edges of the package. Examples of package area connections include ball grid arrays (BGAs; a lead-frame comprising a plurality of solder balls on a surface of a package) and land grid arrays (LGAs; a lead-frame comprising a plurality of stenciled or screened contact pads on a surface of a package). Area connection packages can be advantageous in that they often minimize the lengths of signal traces coupling a package's IC to its lead-frame. They can also interfere with capacitive lead-frame testing in that they sometimes make it difficult to position the sense plate of a capacitive lead-frame tester in close enough proximity to their lead-frames. They can also present a problem as they have a limited area for sensing purposes.

One way to address some of the problems of IC miniaturization is disclosed in U.S. Pat. No. 6,087,842 of Parker et al. entitled "Integrated or Intrapackage Capability for Testing Electrical Continuity Between an Integrated Circuit and Other Circuitry". This patent teaches the placement of a capacitive sensor interior to an IC package. If the placement of such sensor is carefully chosen, the capacitive coupling between the sensor and a package's lead-frame can be increased-in part because the interior placement of the capacitive sensor can circumvent shielding and heat dissipation structures of the IC package.

Another factor that has interfered with the success of capacitive lead-frame testing is the ratio of non-signal leads to total leads on an IC package. As ICs have become more complex and operate at higher frequencies, the ratio of non-signal leads as a fraction of total leads has increased. Typically, the non-signal leads supply power and ground connections, and are redundantly connected in parallel (either on a printed circuit board, within an IC package, or within an IC itself). Capacitive lead-frame testing is not designed to detect opens on such leads. Thus, a significant fraction of IC leads could suffer from opens that cannot be tested.

Another factor that has interfered with the success of capacitive lead-frame testing is socket-mounted IC packages. These packages do not mount directly to a board, but are mounted in sockets that allow them to be added or replaced after a board is manufactured. This adds a layer of complexity to testing in that proper connection between the board and package requires proper connection between the board and socket. If the package is placed in the socket, both sets of connections (i.e., between board and package, and between board and socket) can be tested at once via In-Circuit test, Boundary-Scan test, capacitive lead-frame test, and so on. However, all of these techniques depend on the inserted device's inherent testability for opens coverage; and even if the inserted device is suited to application of these techniques, only signal leads will be adequately tested, and redundant power and ground connections will only be "grossly" tested. If the inserted device has poor testability, neither the inserted device nor the socket will be adequately tested. Also, sockets are easily damaged, so there are opportunities to damage a socket that must be minimized during manufacture, shipping, handling, attachment to the printed circuit board, testing or during insertion of the IC into the socket.

Yet another factor that has frustrated the success of capacitive lead frame testing is the addition of more and more connectors to printed circuit assemblies, such as edge connectors, motherboard connectors, daughter board connectors, etc. These connectors have delicate connector pins that are easily bent or damaged during mating and when left open and unprotected. Connectors must be functional and free of defects, such as open, shorted or misdirected electrical paths. Connectors are becoming denser and more complex., adding to the causes of printed circuit assembly failures during manufacturing, handling and test. The amount of force required to mate these denser connectors is significant and can easily damage or destroy misaligned connector pins, the attachment point between the connector and the circuit assembly or the circuit assembly. Today, automated machines generally handle most aspects of manufacturing, handling and testing of circuit assemblies. However, mating and de-mating of circuit assembly connectors is generally done manually, due to the forces involved and the potential for damage. Thus, it is desirable to limit mating and de-mating circuit assembly connectors during manufacturing, handling and test, in order to avoid damaging the connector and the circuit assembly and to limit manual handling of circuit assemblies to save time and cost.

Accordingly, there is a need for a method and apparatus to test the electrical paths through connectors on printed circuit assemblies that can be automated, while minimizing the risk of damaging the connector or the circuit assembly, reducing testing and handling costs, and increasing testing and handling throughput.

SUMMARY OF THE INVENTION

A device enabling testing continuities of electrical paths through a circuit assembly is presented. The device may comprise a non-contact, connector test probe. The device may comprise a faraday shielded capacitive sense probe for testing a connector of the circuit assembly. A non-contact connector test probe may be manufactured many ways, including printed circuit board technology.

A method testing continuity of electrical paths through a circuit assembly is presented. The method may comprise stimulating one or more nodes of the circuit assembly, capacitively coupling with a non-contact, connector test probe to a connector of the circuit assembly, measuring an electrical characteristic of the circuit assembly with a tester coupled to the non-contact, connector test probe to determine continuity of electrical paths through the circuit assembly.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The United States patent application of Kenneth P. Parker, et al. entitled "Methods and Apparatus for Testing Continuity of Electrical Paths Through Connectors of Circuit Assemblies", USPTO Ser. No. 10/683,693, filed Oct. 9, 2003, is hereby incorporated by reference and discloses how to determine whether defects exist in one or more of a plurality of electrical paths through sockets or other connectors.

Figure 1:
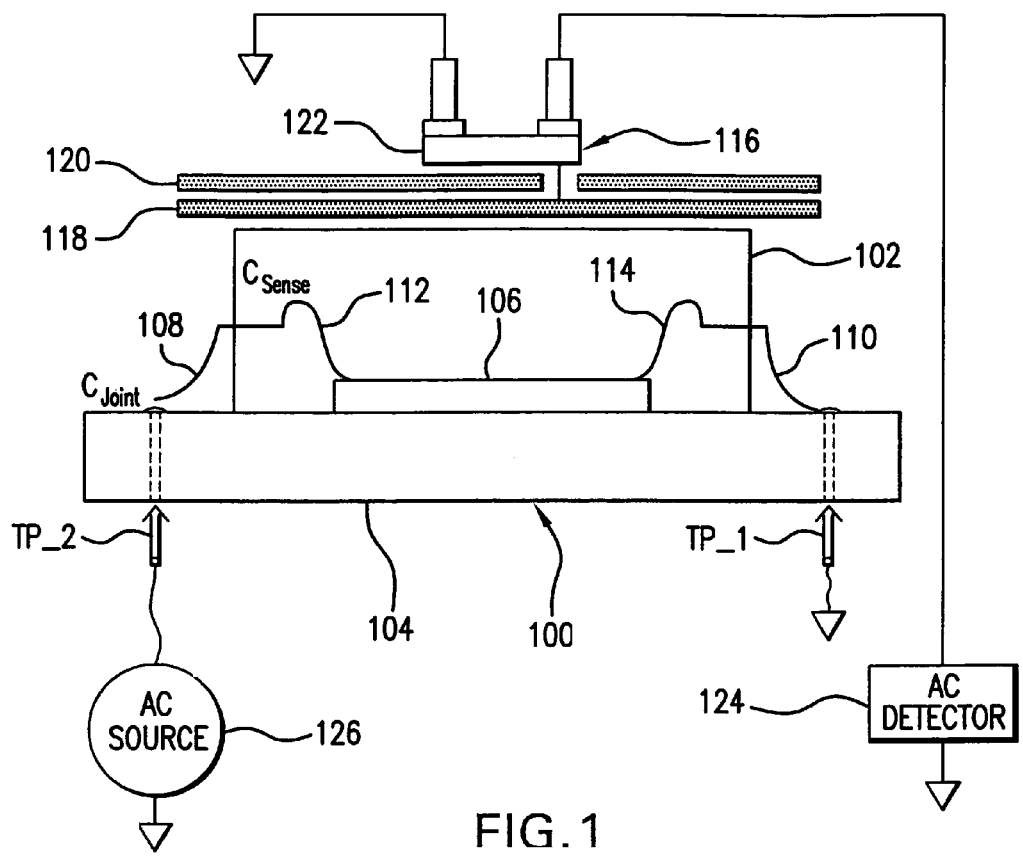
FIG. 1 illustrates an exemplary set-up for capacitive lead-frame testing.
Figure 2:
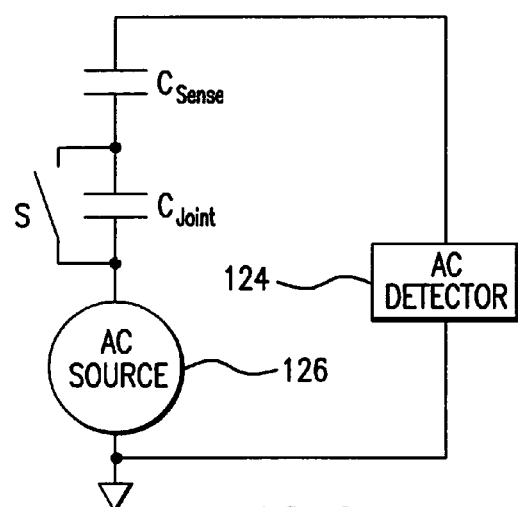
FIG. 2 illustrates an exemplary circuit for capacitive lead-frame testing.
Figure 3:
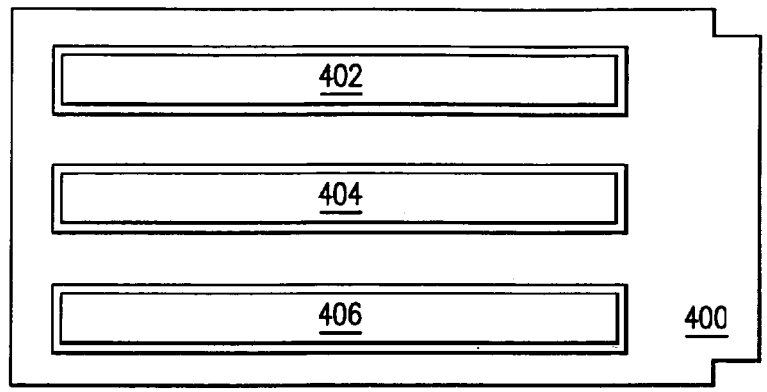
FIG. 3 illustrates a top view of an exemplary circuit assembly with a connector.
Figure 4:
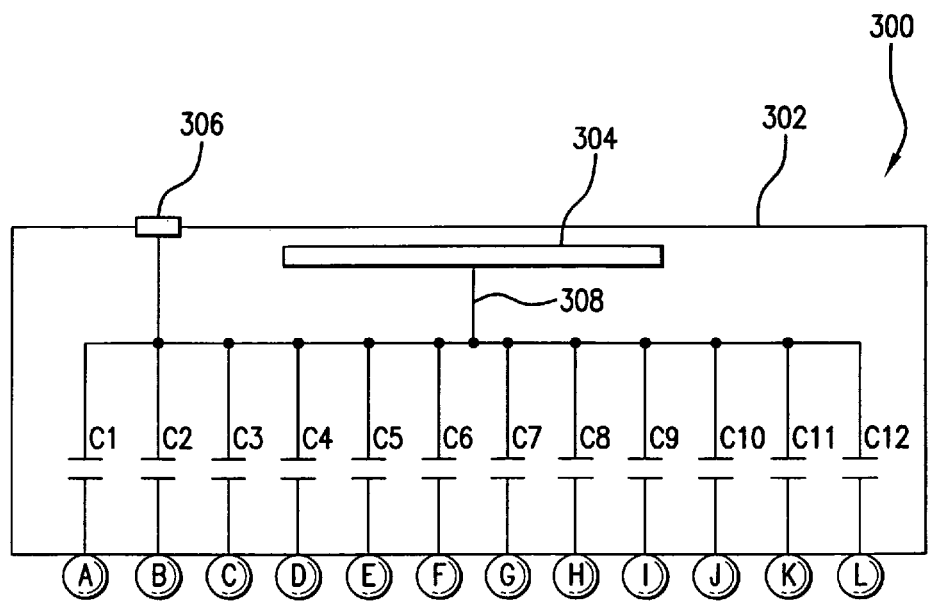
FIG. 4 illustrates an exemplary embodiment of a device for testing continuity of electrical paths through circuit assemblies with connectors.

One exemplary apparatus disclosed in the afore-mentioned patent application is shown in FIGS. 3 and 4. FIG. 3 illustrates a circuit assembly 400 comprising connectors 402, 404, 406 for receiving random access (RAM) modules, mother boards, daughter board, memory cards, etc. FIG. 4 illustrates a first exemplary embodiment of a device 300 for testing continuity of electrical paths through connectors 402, 404 and 406 of a circuit assembly 400. By way of example, the device 300 is configured to test electrical paths of connectors 402, 404 and 406 on circuit assembly 400, shown in FIG. 3.

The device 300 comprising a package 302 containing incomplete or no mission circuitry for the circuit assembly 400 of which the connectors under test 402, 404 and 406 form a part. If the device contains no mission circuitry, the device 300 may be produced based on the structural design of the connectors 402, 404 and 406, and without any knowledge of the functional design of the circuit assembly 400.

The package 302 is provided with a plurality of contacts (identified as contacts A-L) for mating with contacts of the connectors under test 402, 404 and 406. As shown in FIG. 4, the contacts on the package may comprise solder balls of a ball grid array (BGA). The contacts could also take the form of a land grid array (LGA), pins, or other forms of contacts (e.g., PBGA, TBGA, CBGA, CCGA, CLGA, HiTCE, or organic/laminate contacts).

A test sensor port integrated with the package 302 may take one or more of a plurality of forms. For example, as shown in FIG. 4, the test sensor port could comprise one or both of a capacitor plate 304 and an ohmic contact 306. If the test sensor port comprises a capacitor plate, the plate could take the form of an external capacitor plate or, as shown, a capacitor plate 304 that is enclosed within the package 302 so that it may be coupled to using the package 302 as a dielectric.

Integrated with (and possibly enclosed within) the package 302 is a plurality of passive circuit components (identified as capacitors C1–C12) that are coupled in parallel between ones of the plurality of contacts A–L on the package 302 and the test sensor port 304, 306. In FIG. 4, the passive circuit components are shown to be capacitors, each of which is coupled between a different one of the package contacts and a common internal circuit node 308. However, these passive circuit components could take other forms, such as resistors R1–R12, not shown.

In the device embodiment shown in FIG. 4, the values of the parallel capacitors C1–C12 are substantially matched. That is, the relative variation between the capacitors (or error $\epsilon$) is kept to a small value, such as 0.5%. So long as the error $\epsilon$ is small and the value that the capacitors approach is small compared to the normal values of capacitance between contacts of a socket under test, the actual value that the capacitors approach need not be closely controlled. Thus, for example, if the normal values of capacitance between contacts of a socket under test are around one picoFarad (pF), the value that the parallel capacitors approach may be 15 femtoFarads (fF)±0.25%, or alternatively, 14.5 fF±0.25%. Modeling considerations, however, may require keeping the values of the parallel capacitors within some sort of desired value (e.g., 15fF ±5%). The values of the parallel capacitors may be kept small compared to the normal values of connector capacitance so that insertion of the device 300 into a connector under test 402, 404 and 406 will not add significant additional capacitance between contacts one the socket, which may be an important factor for some tests of a circuit assembly.

When the device 300 is mated to a connector 402, 404 or 406 having a plurality of electrically coupled contacts A–L (e.g., a connector having redundant ground contacts), stimulation of the electrically coupled contacts should result in a capacitance of N*C being seen at the test sensor port (where N is the number of redundant contacts of the connector, and C is the value of each of the device's parallel capacitors). If there is an open in one of the paths through the redundant contacts, then the capacitance seen at the test sensor port will be (N−1)*C, with further reductions in capacitance being attributed to additional opens.

An unresolved question, however, is, "If a defect exists, where is the defect in relation to the redundant contacts?" Although the afore-mentioned patent application '693 discloses how to diagnose the locations of defects using intersecting sets of capacitors, an improved means for diagnosing the locations of defects would be desirable.

The United States patent application of Kenneth P. Parker, et al. entitled "Methods and Apparatus for Diagnosing Defect Locations In Electrical Paths of Connectors of Circuit Assemblies", USPTO Ser. No. 10/703,944, filed Nov. 6, 2003, is hereby incorporated by reference and discloses how to diagnose the locations of defects by using coupling capacitances to couple one or more pairs of connector contacts.

Figure 5:
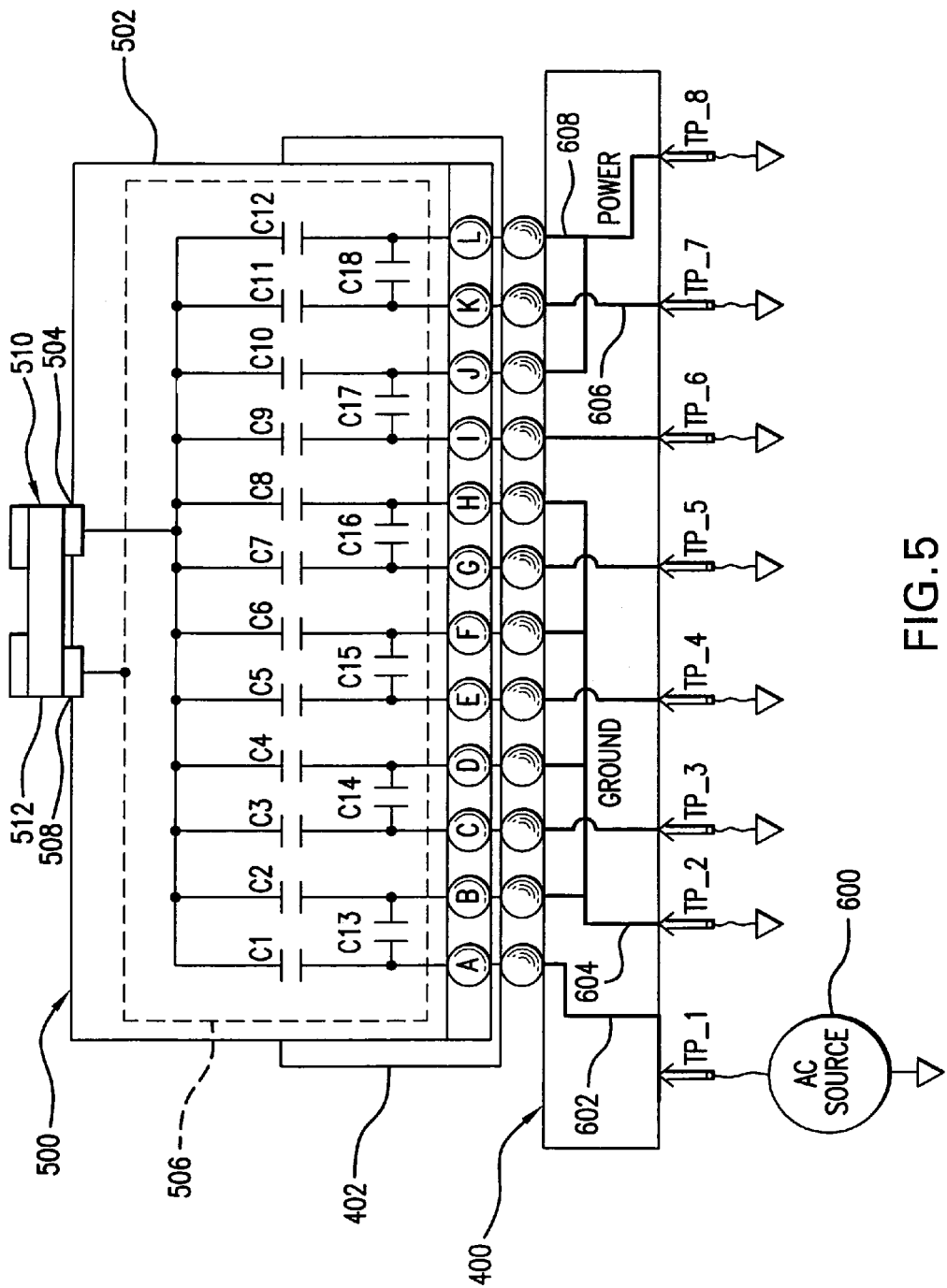
FIG. 5 illustrates an exemplary embodiment of a device for testing continuity of electrical paths through a circuit assembly mated with a connector, with a capacitive lead-frame test assembly coupled to the device.
Figure 6:
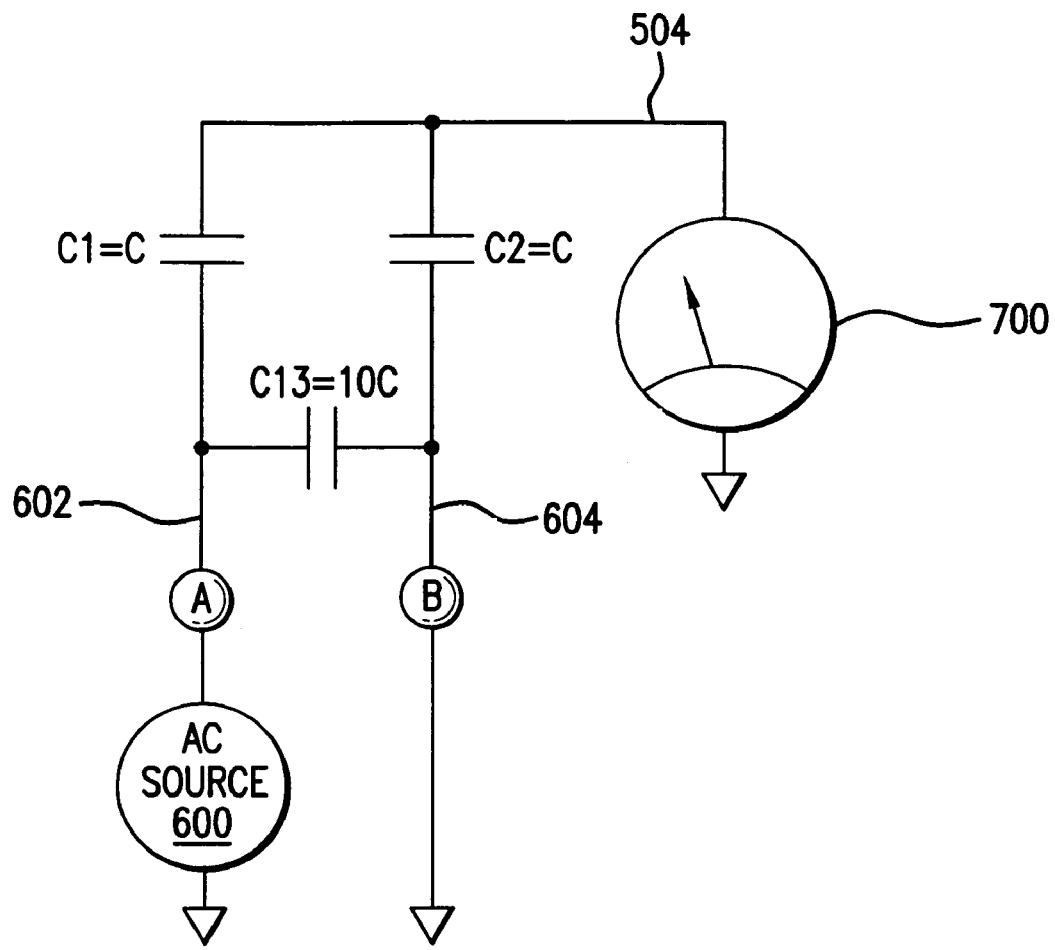
FIG. 6 illustrates an equivalent circuit for the FIG. 5 apparatus during one portion of a test.

The method in the '944 patent application is shown in an exemplary embodiment in FIGS. 5 and 6. The method and device 500 of the '944 application is similar to the method and device 300 of the '693 application having a package 502, an ohmic contact 508, test sensor port 504, and a plurality of capacitors C1–Cl coupled in parallel between a plurality of contacts A–L on the package 502 and the test sensor port 504. The '944 application includes a. second plurality of passive circuit components (capacitors C13–C18) integrated with (and possibly enclosed within) the package 502. Ones of the second plurality of passive circuit components are coupled between ones of the plurality of contacts on the package. For example, capacitor C13 is coupled between contacts A and B. Although the passive circuit components of the second plurality are shown in FIG. 5 to be capacitors, they could take other forms, such as resistors.

To prevent the passive circuit components of the device 500 from picking up stray capacitance from a circuit assembly under test 400, a ground shield 506 may surround the components. The ground shield 506 may have holes therein through which component contacts and other signal wires may be routed. The ground shield 506 may be variously configured, but in one embodiment comprises upper and lower ground planes coupled by a number of conductive vias.

By way of example, the test sensor port of the device 500 may comprise an ohmic contact 508 for coupling to the ground shield 506. In this manor, a capacitive lead-frame test assembly 510 may couple the ground shield 506 to signal ground while reading the capacitance (or other electrical characteristic) of the device 500 at contact 504.

Assume now that the device 500, configured as described in the above paragraphs, is used to test a circuit assembly 400. To prepare for test, the device 500 is mated to a connector 402 of the circuit assembly 400, as shown in FIG. 5. A capacitive lead-frame test assembly 510 is then coupled to the test sensor port 504 of the device 500. As shown, the capacitive lead-frame assembly 510 may comprise a buffer 512.

Those nodes of the circuit assembly 400 that are coupled to contacts A–L of the connector under test 402 are coupled to a number of test probes (e.g., probes TP_1, TP_2, TP_3, TP_4, TP_5, TP_6, TP_7 and TP8). For contacts of the connector 402 that are ganged together (e.g., contacts B, D, F & H which are coupled to GROUND, and contacts J & L which are coupled to POWER), only a single test probe need be coupled to the ganged node. By way of example, the test probes shown in FIG. 5 could be included in a "bed of nails" test fixture.

After preparing the circuit assembly 400 for test, one or more nodes of the circuit assembly 400 are stimulated (e.g., via an AC signal source 600) while other nodes of the circuit assembly are preferably grounded (to reduce noise and extraneous signal pickup). An exemplary test sequence might then commence with the stimulation of node 602 while all other nodes (e.g., nodes 604–608) of the circuit assembly 400 are grounded.

At this point of the test, and assuming that the values of capacitors C1, C2 and C13 are: C1=C, C2=C, and C13=10C, the apparatus shown in FIG. 5 may be reduced to the equivalent circuit shown in FIG. 6.

If connector 402 is in good condition, and is properly coupled to node 602, then node 602 should be shorted to contact A of the device 500, and node 604 should be shorted to contact B of the device 500. Given that the potential at contact B is zero, the capacitance seen at port 504 should be equal to C±$\epsilon$. By way of example, the capacitance seen at port 504 may be derived by measuring the current flow through port 504 using a meter 700.

Assume now that connector 402 is faulty, or is not properly coupled to node 602, such that an open exists between node 602 and contact A. This open will result in a small capacitance being placed in series with capacitor C1, thus reducing the capacitance seen at port 504. For example, if the value of C is 15 fF, and the capacitance contributed by the open is 1 fF, then the capacitance seen at port 504 will be approximately 0.94 fF. This change in the capacitance seen at node 504 (from 15 fF to 0.94 fF), if detectable by the sensitivity of the capacitive lead-frame sensor 510 (and if greater than ε) can be used to determine that an open exists in the electrical path of contact A.

Now assume that connector 402 is faulty, or is not properly coupled to node 604, such that an open exists between node 604 and contact B. With contact B ungrounded, coupling capacitance C13 is now placed in series with capacitance C2. If C13 is much larger than C2 (e.g., an order of magnitude larger, as shown in FIG. 6), then the capacitance seen at port 504 will be approximately C1+C2 (or 2*C in FIG. 6).

Finally, assume that connector 402 is faulty, or is not properly coupled to both of nodes 602 and 604, such that opens exist in the electrical paths of both contacts A and B. In this case, the capacitance seen at port 504 should be near zero. Thus, if there is an open in the electrical path of contact A, it is difficult to assess whether there is also an open in the electrical path of contact B. However, stimulation of node 602 alone does allow the device 500 to provide a means for diagnosing whether an open exists in the electrical path of contact A "or" contact B.

A test of the circuit assembly 400 may continue with the stimulation of node 604 while all other nodes are grounded. Note that node 604 is a ground plane that electrically couples contacts B, D, F & H of the device 500. If connector 402 is in good condition, and is properly coupled to node 604, then node 604 should be shorted to contacts B, D, F & H of the device, and the capacitance seen at port 504 should be equal to 4C±4ε (assuming that the values of capacitors C1–C12 are all equal to C).

Assume now that connector 402 is faulty, or is not properly coupled to node 604, such that one or more opens exist between node 604 and ones of contacts B, D, F and H. For each open, the capacitance seen at port 504 will be reduced. For example, if there is an open between node 604 and contact B, the capacitance seen at port 504 will be reduced by roughly the value of capacitor C2.

Similarly to the way in which the continuity of the electrical path of contact B can be evaluated while stimulating node 602, the continuity of the electrical paths of contacts A, C, E & G can be evaluated, to a degree, while stimulating node 604.

A test of the circuit assembly 400 may continue with sequential stimulation of the nodes connected to probes TP_3-TP_8.

While it was previously indicated that a defect in the electrical path of contact A would result in diagnostic ambiguity as to whether the electrical path of contact B was also faulty, diagnostic results achieved from the sequential stimulation of a plurality of nodes can be variously compared to possibly remove a diagnostic ambiguity. Furthermore, the evaluation of a plurality of diagnostic results can enable one to determine whether a defect in a super node (such as a power or ground plane) is in the vicinity of a particular contact of the device 500, or more in the vicinity of a particular test probe (i.e., such that the defect is noted at a plurality of contacts of the device 500.

Figure 7:
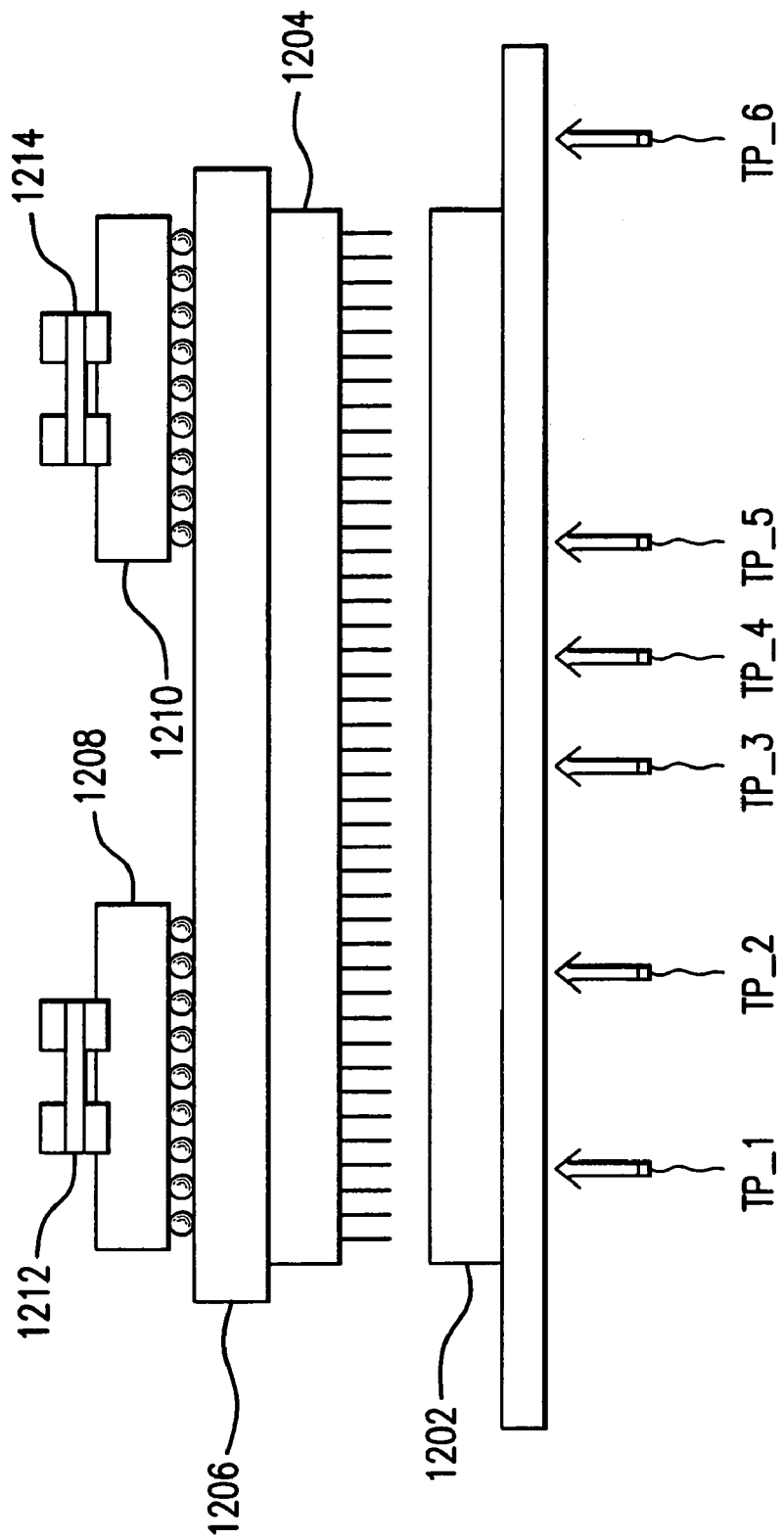
FIG. 7 illustrates how a plurality of test devices as shown in FIGS. 1–6 may be mounted on a printed circuit board or other substrate for the purpose of mating to a connector and testing continuity electrical paths through the connector.

FIG. 7 illustrates how a plurality of the test devices shown in FIGS. 4-6 may be mounted on a printed circuit board 1206 or other substrate for the purpose of testing continuity of electrical paths through a connector 1202 that is too large for the packaging technology that is used to fabricate the test devices (or for testing a connector that is shaped differently than a test device 1208). The printed circuit board 1206 may comprise signal routes for routing contacts of a connector under test 1202 to contacts of the various test devices 1208, 1210 mounted thereon. The printed circuit board may also comprise (or be coupled to) a fixture 1204 for mating the printed circuit board 1206 and test devices 1208, 1210 to a connector 1202. The same or different test assemblies 1212, 1214 may be used to read the capacitance or other electrical characteristic of the test devices 1208, 1210. The testing method for connector may be conducted similar to those for connectors 402, 404 and 406.

While the devices and methods of applications '693 and '944 provide exemplary methods for testing a connector and its connectivity with a circuit assembly, these solutions increase the opportunity to damage the connector, especially connector pins. The testing techniques described above and in applications '693 and '944 require placing a capacitive sense plate device 300, 500, 1204 in close proximity with connectors 402, 404, 406 or 1202 and more likely, mating the sensing device 300, 500, 1204 with the connector 402, 404, 406 or 1202.

Mating a sensing device with a connector, increases manual handling of the circuit assembly, increases the likelihood of damaging the connector, the mating pins of the connector, the attachment of the connector to the circuit assembly or the circuit assembly, itself. Mating sensing devices with connectors also increases handling time, which reduces test throughput and raises costs. If the connectors could be tested without inserting or mating a testing device with the connector, then reduction in connector and circuit assembly damage, parts costs, labor, and testing and handling time could be realized.

Figure 8:
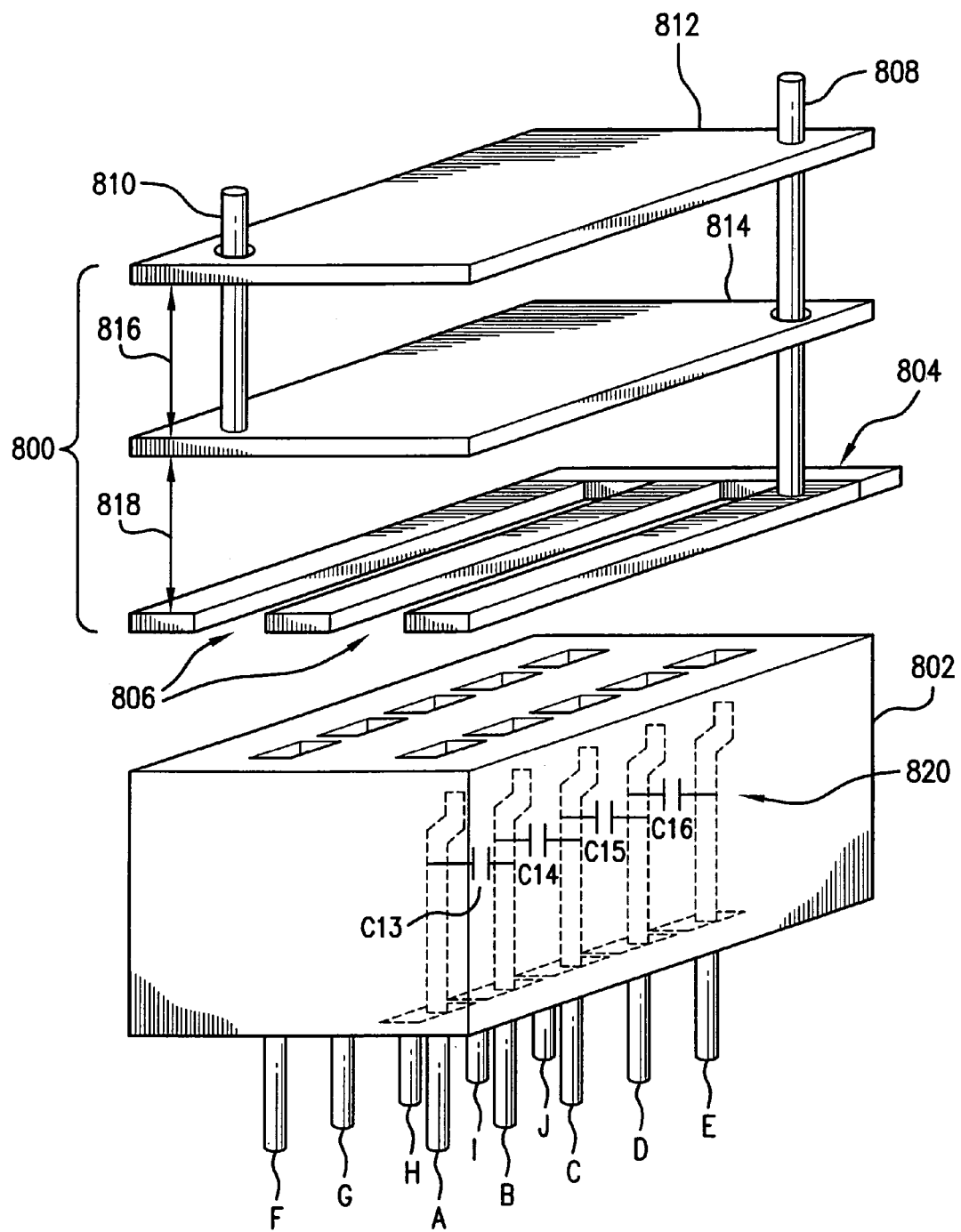
FIG. 8 illustrates a blown-up, perspective view of an exemplary embodiment of a circuit assembly connector with a faraday shielded capacitive sense probe positioned above it.

FIG. 8 illustrates a blown-up, perspective view of an exemplary embodiment of a circuit assembly connector 802 with a faraday shielded sense probe 800. The faraday shielded sense probe 800, comprises sense plate 814 that forms the top half of each sense capacitor, while the top of each connector pin forms the lower plate of each sense capacitor, similar in function to C1–C12 in FIGS. 4–6. Further, the pin-to-pin stray capacitance forms the capacitor coupled pairs C13, C14, C15, C16, etc., needed for coupling signals to power and ground pins, as discussed with respect to capacitors C13–C18 of the capacitive lead frame testing device of FIGS. 5–6.

Sense plate 814 is sandwiched between a top faraday shield plate 812 and a bottom faraday shield plate 804. Top and bottom faraday shield cage plates 814 and 812 are separated from sense plate 814 with a dielectric. The bottom faraday shield plate 804 contains slots 806 to form a sense aperture, exposing the tops of the connector pins in the connector 802 to the sense plate 814. Top faraday shield plate 812 may contain a sense via for sense contact 810. Sense plate 814 may comprise a via so that top and bottom faraday plates 812, 804 may be connected to ground at contact 808. Alternatively, sense plate 814 may be surrounded (separated by a dielectric), by a single faraday shield, except for sense apertures 806 and sense contact 810.

Probe 800 may be manufactured of any known method. For example, probe 800 may be manufactured using standard printed circuit board dimensions and manufacturing methods. For example, sense plate 814, dielectric 816 and shield plate 812 may comprise a printed circuit board with two copper sides. Then shield 804 and dielectric 818 may be a single copper sided printed circuit board laminated to the first printed circuit board (comprising layers 812, 816, 814). Standard printed circuit board vias may connect the two shield layers 812 and 804. Standard printed circuit board vias may provide access to the sense plate 814. Channels 806 may be formed by etching or printed circuit board techniques creating patterns in the pattern. The positioning guide 850 may be formed by gluing or otherwise attaching non-conductive material to the bottom shield plate 804. Many other methods of manufacturing probe 800 are anticipated without deviating from the teachings herein.

Figure 9:
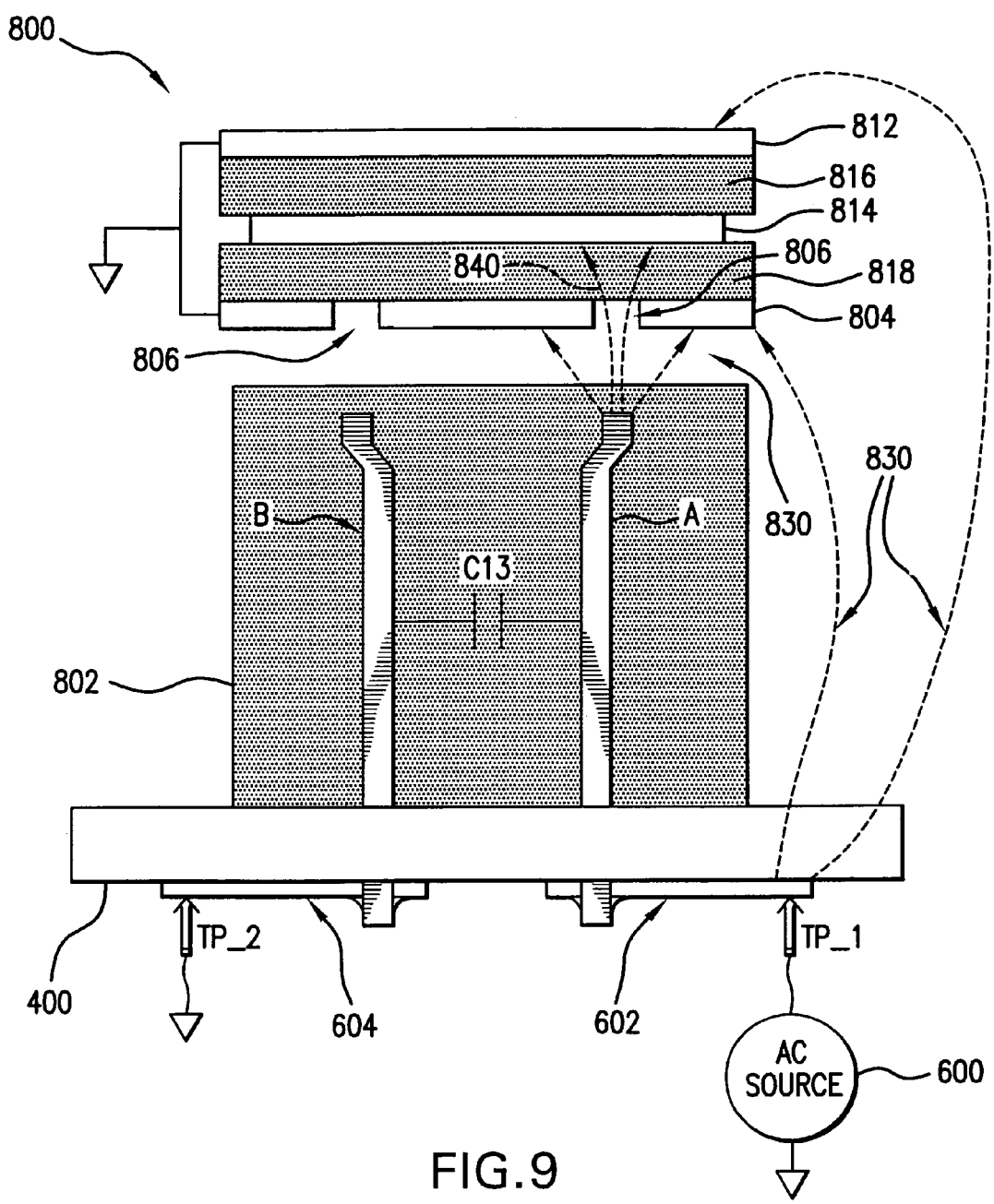
FIG. 9 illustrates a cut-away, end view of an exemplary embodiment of a connector mounted on a circuit assembly with a faraday shielded capacitive sense probe positioned above and capacitively coupled to a capacitive lead-frame test assembly.

FIG. 9 shows a cutaway, end-view of the connector 802 mounted on a circuit assembly 400 with a faraday shield sense probe 800 floated above. The testing method is similar to that taught above with respect to FIGS. 5–6. By way of example, connector pin B is grounded by test probe TP_2 in contact with contact 604 of circuit assembly 400. Connector pin A is stimulated at contact 602 on circuit assembly 400. Capacitive coupling is created by electric field force lines that connect the top of the connector pin A to the sense plate 814. The amount of coupling can be controlled by the width of the apertures 806 and the height of the aperture and sense plate 814 above the connector pins. Additional electric field force lines 830 that represent interference from the unwanted sources, such as the fixture and circuit traces below the connector 802 on the circuit assembly 400, are blocked by the faraday shield, both below and above the sense plate 814 by bottom and top plates 804, 812. There may be a small amount of unwanted coupling from these sources that travel through the apertures, but these are attenuated by the size of the aperture and the ratio of distances of the pin-to-sense plate and board-to-sense plate. These factors can be controlled by the shape and size of the probe 800 and channels 806 in the bottom shield plate to keep the unwanted coupling from distorting the measurements.

The design of the faraday shield sense probe must choose an amount of sense coupling that produces the desired ratio of sense coupling capacitance to pin-pair coupling capacitance. Since connector vendors are generally able to supply the pin-pair capacitance that is inherent in their connector design or this capacitance may be readily determined, this number can be used to determine the sense capacitance that is needed, for example, 1/10 the pin-pair capacitance.

Figure 10:
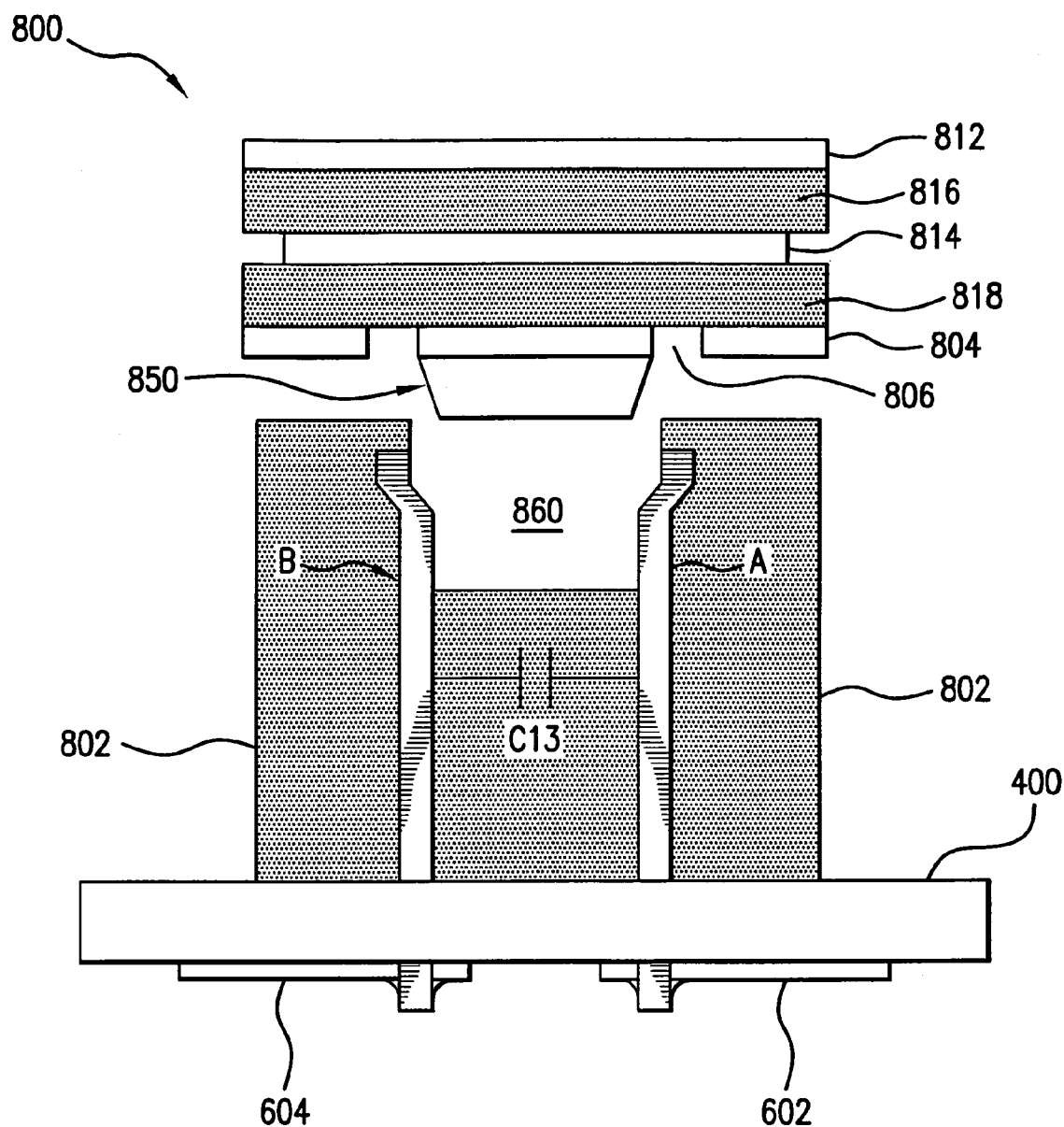
FIG. 10 illustrates a cut-away, end view of another exemplary embodiment of a connector mounted on a circuit assembly with a faraday shielded capacitive sense probe with a positioning guide for aligning the probe with a channel of a connector, so that the probe is positioned over the connector.

It may be desirable to assure the sense aperture 806 is positioned correctly over the tops of the connector pins to be sensed. Lateral displacements could partially decouple the intended sense capacitance between the sense plate 814 and the connector pins and permit unwanted coupling from outside sources. As shown in FIG. 10, most connectors have guide channels or keys 860 to facilitate the alignment and mating of connector halves.

Therefore, another embodiment of the faraday shield sense probe 800 may include a positioning guide 850 to help ensure proper alignment of the faraday shield sense probe 800 over the connector pins of the connector under test 802. The positioning guide may be formed of a non-conductive material, such as plastic, or any other known non-conductive material, so as not to distort or interfere with the path of the electric field 840 to the sense plate 814.

Figure 11:
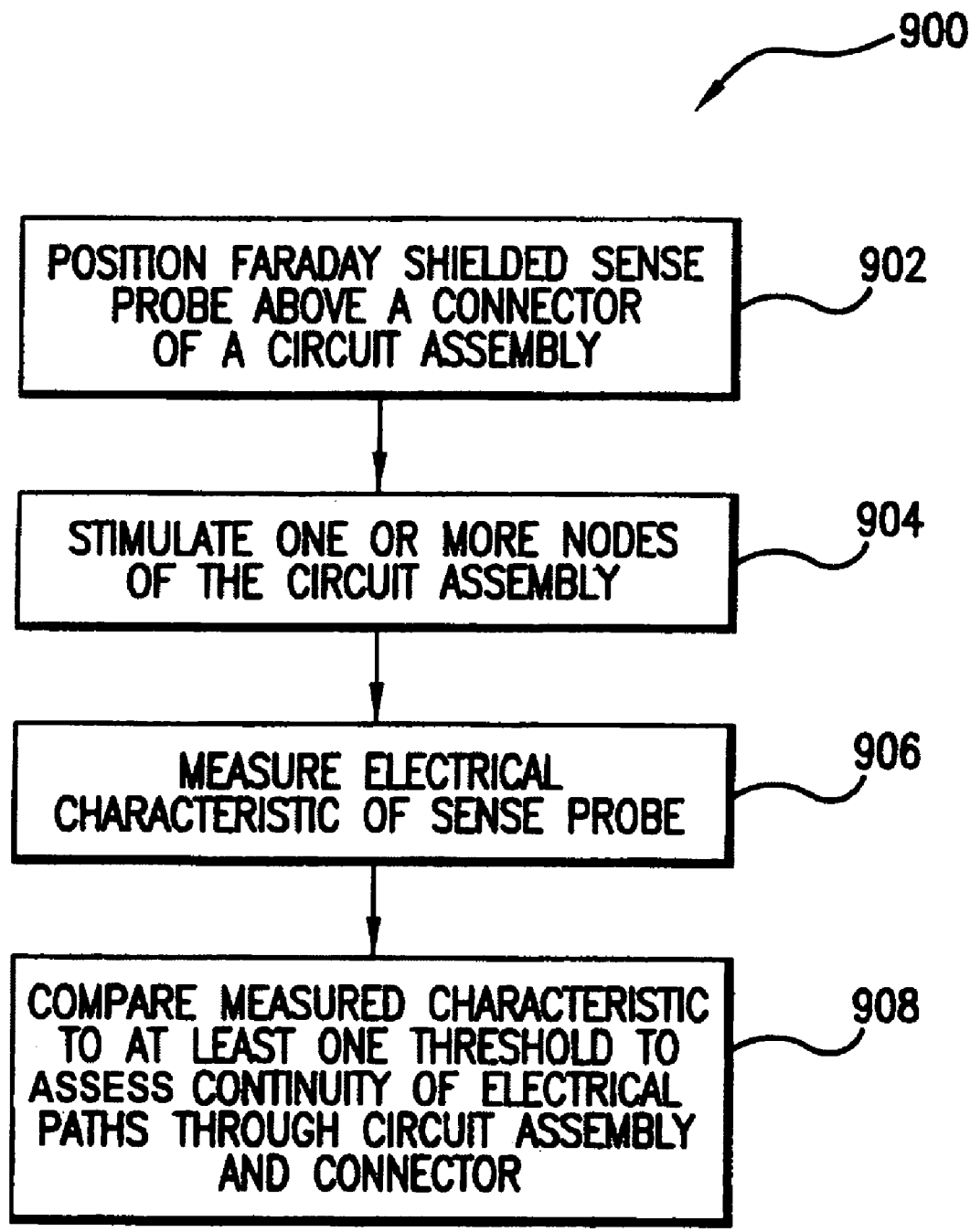
FIG. 11 illustrates a flow chart for an exemplary method for testing continuity of electrical paths through a connector on a circuit assembly.

FIG. 11 illustrates a method 900 for testing continuity of electrical paths through a circuit assembly using the device shown in FIGS. 8–10. The method 900 commences with positioning 902 of a faraday shielded sense probe above a connector of the circuit assembly. The method continues with the stimulation 904 of one or more nodes of the circuit assembly, followed by the measurement 906 of an electrical characteristic of the sense probe. Finally, the measured electrical characteristic(s) are compared 908 to at least one threshold to assess continuities of one or more electrical paths of the circuit assembly and connector. If the measured electrical characteristic is capacitance, the capacitance may be measured by means of a capacitive lead-frame assembly as taught above with reference to FIGS. 1–7.

While particular embodiments have been disclosed herein to illustrate and teach the invention, other embodiments are also anticipated. For example, the present testing techniques provide for testing the continuity of the circuit assembly, the contact of the connector and circuit assembly, and the internal electrical continuity of the connector. The internal electrical continuity of the connector itself prior to attachment to a circuit assembly may also be tested by stimulating contacts of the connector, rather than stimulating contacts of the circuit assembly. It may be desirable for testing of large connectors, complex connectors, connectors with internal circuitry, or connectors prone to failure, prior to attaching them to a printed circuit assembly. Another embodiment may include a two-layer plate where the apertures 804 share the same layer with the sense plate 814. Another embodiment might include a plate with selectable apertures where the test might use the most appropriate combination of apertures for the particular device being test.

The teachings herein, may also be used to perform other tests of connectors or circuit assemblies with connectors besides electrical continuity, such as determining attachment of specific connectors at specific connector locations on a circuit assembly comprising more than one connector or determining if connectors are attached in the appropriate orientation on the circuit assembly. The faraday shield could surround the sense plate, except for sense apertures and sense and ground vias, rather than being made of top and bottom shield plates. The present non-contact connector test probe may also be utilized to stimulate and test circuitry or components on a circuit assembly with limited access. While the measured electrical characteristic disclosed was capacitance, for purposes of illustration, other electrical characteristics may be measured, such as inductance. Also, the electrical continuity of more than one connector on a circuit assembly may be tested simultaneously using the teachings of the present invention. All of the above testing scenarios are within the scope of these teachings and anticipated by the inventor.

Although this preferred embodiment of the present invention has been disclosed for illustrative purposes, those skilled in the art will appreciate that various modifications, additions and substitutions are possible, without departing from the scope and spirit of the invention, resulting in equivalent embodiments that remain within the scope of the appended claims. The appended claims are intended to be construed to include such variations, except as limited by the prior art.

What is claimed is:

1. A non-contact test probe for testing continuity of electrical paths through a connector of a circuit assembly, comprising:
   a bottom faraday shield plate with sensing apertures;
   a top faraday shield plate; and
   a sense plate disposed between the top and bottom faraday shield plates;
   wherein the bottom faraday shield plate, the top faraday shield plate, and the sense plate are implemented as conductive layers separated by dielectric layers in a printed circuit board.

2. The device according to claim 1, wherein the non-contact test probe is configured to capacitively couple with electrical paths through the connector of a circuit assembly.

3. The device according to claim 2, wherein the non-contact test probe is configured to capacitively couple with a capacitive lead-frame assembly of a tester.

4. The device according to claim 1, wherein the test probe comprises a faraday shielded capacitive sense plate.

5. The device according to claim 1, wherein the test probe further comprises a positioning guide which mates to a guide channel within the connector for facilitating positioning of the test probe over a guide channel and connector pins of the connector.

6. A non-contact test probe for testing continuity of electrical paths through a connector of a circuit assembly, comprising:
a bottom faraday shield plate with sensing apertures;
a top faraday shield plate;
a sense plate disposed between the top and bottom faraday shield plates; and
a positioning guide a positioning guide which mates to a guide channel within the connector for facilitating positioning of the test probe over a guide channel and connector pins of the connector for facilitating positioning of the test probe over a guide channel and connector pins of the connector.

7. The device according to claim 1, wherein the top faraday shield plate and the bottom faraday shield plate are connected to one another only by one or more conductive vias in the printed circuit board.

* * * * *

UNITED STATES PATENT AND TRADEMARK OFFICE
CERTIFICATE OF CORRECTION

PATENT NO.        : 7,123,022 B2
APPLICATION NO. : 10/836862
DATED             : October 17, 2006
INVENTOR(S)       : Parker et al.

It is certified that error appears in the above-identified patent and that said Letters Patent is hereby corrected as shown below:

Column 12, line 3, in Claim 6, after "a positioning guide" delete "a positioning guide". (Second Occurrence)

Signed and Sealed this

Twentieth Day of March, 2007

JON W. DUDAS
*Director of the United States Patent and Trademark Office*